United States Patent
Vu et al.

(10) Patent No.: US 9,255,345 B2
(45) Date of Patent: Feb. 9, 2016

(54) METHOD FOR GROWING GERMANIUM/SILICON—GERMANIUM SUPERLATTICE

(71) Applicant: BAE SYSTEMS Information & Electronic Systems Integration Inc., Nashua, NH (US)

(72) Inventors: Vu Anh Vu, Falls Church, VA (US); Sandra L. Hyland, Falls Church, VA (US); Robert L. Kamocsai, Manassas, VA (US); Daniel J. O'Donnell, Manassas, VA (US); Andrew T. Pomerene, Leesburg, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 14/332,653

(22) Filed: Jul. 16, 2014

(65) Prior Publication Data

US 2015/0028286 A1    Jan. 29, 2015

Related U.S. Application Data

(60) Provisional application No. 61/858,649, filed on Jul. 26, 2013.

(51) Int. Cl.
| | | |
|---|---|---|
| *H01L 21/00* | (2006.01) | |
| *C30B 25/16* | (2006.01) | |
| *H01L 31/028* | (2006.01) | |
| *H01L 31/111* | (2006.01) | |
| *C30B 29/68* | (2006.01) | |
| *C30B 29/52* | (2006.01) | |
| *C30B 29/06* | (2006.01) | |
| *H01L 21/02* | (2006.01) | |
| *H01L 27/144* | (2006.01) | |

(52) U.S. Cl.
CPC .............. *C30B 25/165* (2013.01); *C30B 29/06* (2013.01); *C30B 29/52* (2013.01); *C30B 29/68* (2013.01); *H01L 21/02507* (2013.01); *H01L 21/02532* (2013.01); *H01L 27/1446* (2013.01); *H01L 31/028* (2013.01); *H01L 31/111* (2013.01)

(58) Field of Classification Search
None
See application file for complete search history.

(56) References Cited

U.S. PATENT DOCUMENTS

2011/0036289 A1*  2/2011  Carothers ......... H01L 21/02381
                                                              117/94

* cited by examiner

*Primary Examiner* — Sonya D McCall Shepard
(74) *Attorney, Agent, or Firm* — Maine Cernota & Rardin; David A. Rardin; Daniel J. Long

(57) ABSTRACT

A bulk manufacturing method for growing silicon-germanium stained-layer superlattice (SLS) using an ultra-high vacuum-chemical vapor deposition (UHV-CVD) system and a detector using it is disclosed. The growth method overcomes the stress caused by silicon and germanium lattice mismatch, and leads to uniform, defect-free layer-by-layer growth. Flushing hydrogen between the layer growths creates abrupt junctions between superlattice structure (SLS) layers. Steps include flowing a mixture of phosphine and germane gases over a germanium seed layer. This in-situ doped germanium growth step produces an n-doped germanium layer. Some of the phosphorus diffuses into the underlying germanium and reduces the stress in the underlying germanium that is initially created by the lattice mismatch between germanium and silicon. Phosphine can be replaced by diborane if a p-doped layer is desired. The reduction of stress results in a smooth bulk germanium growth.

20 Claims, 3 Drawing Sheets

FLOW CHART

DEVICE CROSS-SECTION (NOT TO SCALE)

SHORT WAVE INFRARED FOCAL PLANE ARRAY

FLOW CHART

METHOD FOR GROWING GERMANIUM/SILICON—GERMANIUM SUPERLATTICE

RELATED APPLICATIONS

This application claims the benefit of U.S. Provisional Application No. 61/858,649 filed Jul. 26, 2013. This application is herein incorporated by reference in its entirety for all purposes.

FIELD OF THE INVENTION

The invention relates to a device and a method for growing silicon-germanium superlattice structure on silicon substrates.

BACKGROUND

An existing material used for manufacturing short wave-infrared focal-plane arrays (SWIR FPA) is InGaAs, which is expensive and incompatible with silicon processing. Silicon-germanium strained-layer superlattice structure (Si:Ge SLS) is used as an alternative. However, growing uniform single-crystal germanium on silicon substrate is a challenge due to silicon and germanium lattice mismatch. Growing an ultrathin layer of germanium on top of a layer of silicon-germanium, or alternating layers of silicon-germanium with varying silicon content, with abrupt transitions for making hundreds of pairs of layers of strained-layer superlattice is another challenge. What is needed is a method for growing silicon-germanium strained-layer superlattice structure on silicon substrates that overcomes silicon and germanium lattice mismatch and provides an ultrathin layer of germanium on top of a layer of silicon-germanium with abrupt layer transitions for making hundreds of pairs of layers of superlattice that is which is less expensive and compatible with silicon processing.

SUMMARY OF THE INVENTION

An embodiment provides a method of growing a germanium/silicon-germanium strained-layer superlattice structure comprising the steps of (a) preconditioning a silicon substrate with hydrogen gas with a pressure at most equal to approximately $3E^{-4}$ mBar; (b) reducing temperature and pressure; (c) providing germane gas with a pressure at most equal to approximately $5E^{-4}$ mBar flowing over the silicon substrate to form a germanium seed layer; (d) heating in approximately a vacuum; (e) flowing gasses with a pressure at most equal to approximately $5E^{-4}$ mBar over the germanium seed layer to form a doped germanium layer; (f) flowing germane gas with a pressure at most equal to approximately $5E^{-4}$ mBar over the germanium layer forming a first buffer; (g) flowing at least germane gas over the first buffer with a pressure at most equal to approximately $5E^{-4}$ mBar, forming a layer of single-crystal comprising at least germanium; (h) flushing with hydrogen or allowing to remain idle; (i) flowing gasses over the single-crystal comprising at least germanium layer with a pressure at most approximately $5E^{-4}$ mBar, forming a subsequent layer of single-crystal silicon-germanium; (j) flushing with hydrogen or allowing to remain idle; (k) repeating steps (g) through (j) multiple times, forming SLS layers (at least one of the alternating layers is silicon-germanium); (l) flowing germane gas with a pressure at most equal to approximately $5E^{-4}$ mBar over a germanium layer forming a second buffer; and (m) flowing gasses with a pressure at most equal to approximately $5E^{-4}$ mBar over the second buffer to form a doped layer. In embodiments, in step (a) preconditioning occurs at approximately 750° C. for approximately 60 minutes. In other embodiments, in step (b) the temperature is reduced to approximately 350° C. and the pressure is reduced to approximately vacuum. In subsequent embodiments the temperature is reduced at a rate of approximately 2° C./min. For additional embodiments, in step (c) the germane gas is flowed over the silicon substrate for approximately 120 minutes. In another embodiment, in step (d) the heating occurs at approximately 2° C./min until the temperature is approximately 600° C. In included embodiments, in step (e) the gasses are selected from the group consisting of phosphine, diborane and germane for an n-doped layer, or selected from the group consisting of germane and diborane for a p-doped layer. In yet further embodiments, in step (e) the phosphine and germane gasses are provided at a ratio of approximately 1:3 respectively for approximately 10 minutes. Embodiments further provide that in step (e) the phosphine and germane gasses are provided such that the germanium seed layer is doped with phosphorus at a concentration of approximately $1E^{18}$ atoms/cm$^3$. For a following embodiment, step (f) occurs for approximately 20 minutes, step (g) occurs for approximately 1 minute, and step (h) occurs for approximately 2 minutes. In subsequent embodiments, in steps g and i, at least one gas is selected from the group consisting of silane and germane (at least one of the alternating layers is silicon-germanium). In additional embodiments, in step (i) the gasses are provided in a 4:1 ratio of silane and germane. In included embodiments step (i) occurs for approximately 90 seconds, step (l) occurs for approximately 20 minutes, and step (m) occurs for approximately 30 minutes. Another embodiment provides that in step (m) the gasses are selected from the group consisting of germane and diborane for a p-doped layer, or selected from the group consisting of phosphine, diborane and germane for an n-doped layer. In related embodiments, the gasses in step (m) occur at approximately a 1:50 ratio. For further embodiments, in step (m) a p-doped layer comprises a boron concentration of $5E^{17}$ atoms/cm$^3$. In yet further embodiments, steps (g)-(j) are repeated to form at least 2 layers.

Another embodiment provides a method of growing a germanium/silicon-germanium superlattice structure (SLS) comprising (a) preconditioning a silicon substrate with hydrogen gas at approximately 750° C. for 60 minutes with a pressure approximately equal to $3E^{-4}$ mBar; (b) reducing temperature to 350° C. at the rate of 2° C./min while maintaining vacuum as in (a); (c) flowing germane gas with a pressure equal to approximately $5E^{-4}$ mBar over the silicon substrate for approximately 120 minutes to form a germanium seed layer; (d) heating the germanium seed layer at approximately 2° C./min to approximately 600° C. while maintaining vacuum as in (c); (e) flowing phosphine and germane gasses at a ratio of approximately 1:3 respectively with a pressure approximately equal to $5E^{-4}$ mBar over the germanium seed layer for approximately 10 minutes to form an n-doped germanium layer; (f) flowing germane gas with a pressure approximately equal to $5E^{-4}$ mBar over the n-doped layer for approximately 20 minutes to grow a first buffer layer of germanium; (g) flowing at least germane gas with a pressure approximately equal to $5E^{-4}$ mBar for approximately 1 minute to form a layer of single-crystal comprising at least germanium; (h) flushing with hydrogen or allowing to sit idle under vacuum for approximately 2 minutes so that an abrupt junction will form when silicon-germanium is later grown on the existing germanium; (i) flowing a 4:1 mixture of silane and germane gases with a pressure of approximately $5E^{-4}$ mBar for approximately 90 seconds to grow a layer of silicon-germanium on the layer of single-crystal comprising at least germanium; (j) flushing with hydrogen or allowing to sit idle under vacuum for approximately 2 minutes so that an abrupt junction will form when germanium is later grown on the existing silicon-germanium; (k) repeating steps (g) through (j) multiple times, forming SLS layers; (l) flowing germane gas with a pressure approximately equal to $5E^{-4}$ mBar for approximately 20 minutes to grow a second buffer layer of single-crystal germanium on the layer of silicon-germanium; and (m) flowing diborane and germane gasses in a ratio of approximately 1:50 respectively with a pressure approximately equal to $5E^{-4}$ mBar for approximately 30 minutes over the second buffer to form a p-doped layer. In ensuing embodiments, the p-doped layer is approximately 1000 Å thick.

A yet further embodiment provides a short wave-infrared focal-plane array (SWIR FPA) comprising a detector with layers formed by bulk manufacturing processes and having abrupt transitions between strained-layer superlattice structure (SLS) layers comprising the steps of (a) preconditioning a silicon substrate with hydrogen gas with a pressure at most equal to approximately $3E^{-4}$ mBar; (b) reducing temperature and pressure; (c) providing germane gas with a pressure at most equal to approximately $5E^{-4}$ mBar flowing over the silicon substrate to form a germanium seed layer; (d) heating in approximately a vacuum; (e) flowing gasses with a pressure at most equal to approximately $5E^{-4}$ mBar over the germanium seed layer to form an n-doped germanium layer; (f) flowing germane gas with a pressure at most equal to approximately $5E^{-4}$ mBar over the germanium layer forming a first buffer; (g) flowing at least germane gas over the first buffer with a pressure at most equal to approximately $5E^{-4}$ mBar, forming a layer of single-crystal comprising at least germanium; (h) flushing with hydrogen or allowing to remain idle; (i) flowing at least one gas over the single-crystal comprising at least germanium layer with a pressure at most approximately $5E^{-4}$ mBar, forming a subsequent layer of single-crystal comprising at least germanium; (j) flushing with hydrogen or allowing to remain idle; (k) repeating steps (g) through (j) multiple times, forming SLS layers; (l) flowing germane gas with a pressure at most equal to approximately $5E^{-4}$ mBar over a germanium layer forming a second buffer; and (m) flowing gasses with a pressure at most equal to approximately $5E^{-4}$ mBar over the second buffer to form a p-doped layer, whereby the bulk manufacturing processes form the SWIR FPA having abrupt transitions between SLS layers.

DETAILED DESCRIPTION

Figure 1:
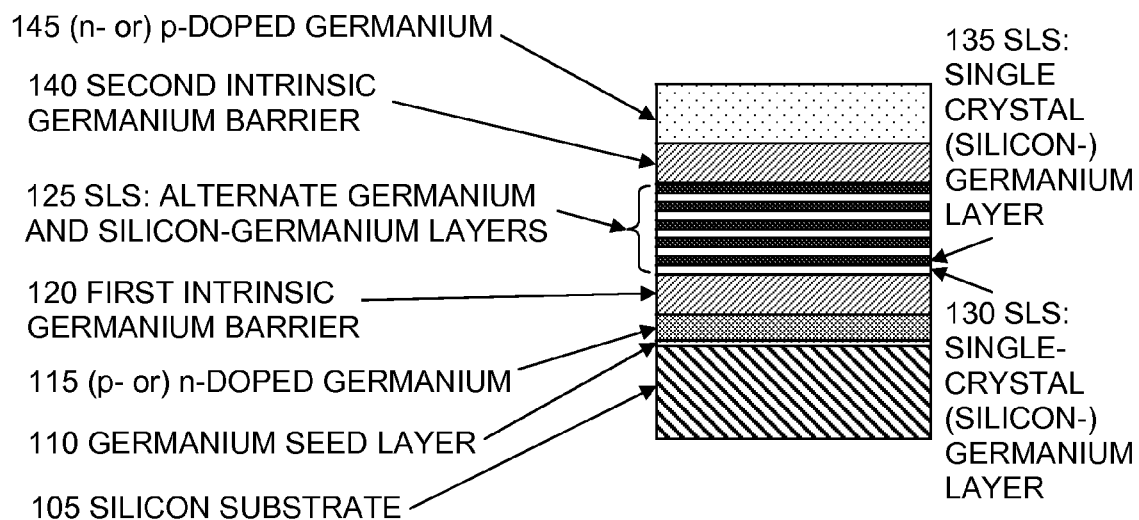
FIG. 1 is a depiction of a cross-section of a device formed in accordance with an embodiment of the invention.

The following detailed description provides example embodiments of the presently claimed invention with references to the accompanying drawings. The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. Embodiments are described in sufficient detail to enable one of ordinary skill in the art to practice the subject invention. The invention is susceptible of many embodiments. What follows is illustrative, but not exhaustive, of the scope of the invention.

Embodiments provide a method of growing a p-SLS-n stack for making vertical p-i-n photodetectors using an ultra-high vacuum-chemical vapor deposition (UHV-CVD) method. This Si:Ge SLS can be manufactured in a commercial Si CMOS factory and is compatible with standard Si CMOS manufacturing processes. SLS embodiments can be engineered to detect photons with energies below the bandgap of its constituent materials ($\lambda_{SLS}>1.8$ µm, $\lambda_{Si}=1.1$ µm and $\lambda_{G3}=1.8$ µm). This enables photodetectors to detect infrared radiation farther into the infrared spectrum than photodetectors made from either of the constituent materials. Noise current is dominated by SLS and bandgap of Si and Ge. Spectral response is controlled by the bandgap of the SLS.

The SLS structure comprises SiGe/SiGe layers with varying amounts of Si in layers. For example, the first SiGe layer (and alternate layers) could use a 1:10 silane:germane ratio and the second layer (and interleaved layers) could use a 4:1 silane:germane ratio to create a first layer with significantly less silicon content than the second layer. For an embodiment, 0% Si (pure Ge) is used for the first layer and the alternate layers, and a 4:1 ratio of silane:germane for the second and interleaved layers.

The n-type-germanium/SLS/p-type-germanium stack is formed using a UHV CVD system. In embodiments, the formation is completed by using the following gases: hydrogen, 100% silane ($SiH_4$), 100% germane ($GeH_4$), 500 ppm diborane ($B_2H_6$) and 500 ppm phosphine ($PH_3$).

A. First, a silicon substrate is preconditioned with hydrogen gas at 750 degrees C. for 60 minutes. The pressure of hydrogen is controlled at $3E^{-4}$ mBar.

B. Next, the temperature is ramped down from 750 degrees C. to 350 degrees C. in 200 minutes in vacuum at 2 degrees C. per minute.

C. Germane gas at $5E^{-4}$ mBar is flowed over the preconditioned silicon substrate for 120 minutes. This step initiates the layer by layer growth of a germanium seed layer for approximately the first ten layers of defect-free single crystal germanium.

D. The temperature is then ramped back up from 350 degrees C. to 600 degrees C. in 125 minutes in vacuum at 2 degrees C. per minute.

E. 1:3 mixture of phosphine and germane gases at $5E^{-4}$ mBar is flowed over the germanium seed layer for 10 minutes. This in-situ doped germanium growth step produces approximately 400 Å of an n-doped germanium layer with a phosphorus concentration of $1E^{18}$ atoms/cm$^3$. Some of the phosphorus diffuses into the underlying germanium and reduces the stress in the underlying germanium. The stress in the germanium is initially created by the lattice mismatch between germanium and silicon. Phosphine can be replaced by diborane if a p-doped layer is desired.

F. Germane gas at $5E^{-4}$ mBar is then flowed over the germanium layer for 20 minutes. A 600 Å thick layer of intrinsic single-crystal germanium forms a first buffer to prevent dopants from diffusing into the SLS. For embodiments, the layer of intrinsic single-crystal germanium buffer is a minimum of 600 Å thick.

SLS Layers Formation

G. Germane gas at $5E^{-4}$ mBar is then flowed for 60 seconds forming a 30 Å thick layer of intrinsic single-crystal germanium. The first 30 Å thick layer of intrinsic single-crystal germanium forms the first layer of the SLS. For embodiments, silane gas can be included to form a single crystal silicon-germanium layer with sufficiently different composition from the second silicon-germanium layer to create the strain needed for a strained-layer superlattice (SLS). Steps F and G employ the same process conditions. Step G is presented as a component of the repeated steps provided in step K (repeated 30 Å thick layer of intrinsic single-crystal germanium).

H. Gases are turned off. The tube is either idle or flushed with hydrogen for 2 minutes. This makes the germanium/silicon-germanium junction abrupt.

I. A 4:1 mixture of silane and germane gases at $5E^{-4}$ mBar is flowed over the germanium layer for 90 seconds. A 50 Å thick layer of intrinsic single crystal silicon-germanium forms the second layer of the SLS, and also completes the first pair of SLS layers. For embodiments, instead of a 4:1 mixture, silane can be increased or reduced to provide the strain needed to create a strained-layer superlattice.

J. Gases are turned off. The tube is either idle or flushed with hydrogen for 2 minutes. This makes the (silicon-)germanium/(silicon-) germanium junction abrupt.

K. Repeat steps G through step J until the desired number of layers is obtained.

L. Germane gas at $5E^{-4}$ mBar is then flowed over the germanium layer for 20 minutes. A 600 Å thick layer of intrinsic single crystal germanium forms a second buffer layer to prevent dopants from diffusing into the SLS and to keep the p-contact layer from destroying the topo layer of the SLS structure.

M. A 1:50 mixture of diborane and germane gases at $5E^{-4}$ mBar is flowed over the germanium layer for 30 minutes. This in-situ doped germanium growth step produces approximately 1000 Å of a p-doped layer with a boron concentration of $5E^{17}$ atoms/cm$^3$. Diborane can be replaced by phosphine if an n-doped layer is desired.

A uniform n-type-germanium/SLS/p-type-germanium stack with extremely low level of defects can be formed by following the above-mentioned steps with the specified conditions.

Steps B-E provide a seed layer and a doped transition layer, and are key to growing a smooth bulk germanium layer on a silicon substrate. Some of the phosphorus diffuses into the underlying germanium and reduces the stress in the underlying germanium. The stress is generated by the lattice mismatch between germanium and silicon. The reduction of stress results in a smooth bulk germanium growth.

The smooth defect-free n-Ge/SLS/p-Ge stack film described above can be used to produce vertical germanium photodetectors.

FIG. 1 is a cross-section of a device formed in accordance with an embodiment 100. It depicts an n-type-germanium/SLS/p-type-germanium (n-Ge/SLS/p-Ge) stack formed on substrate 105. Adjacent to substrate 105 is thin (a few atomic layers thick) undoped single-crystal germanium seed layer 110; followed by n-doped germanium layer 115. In embodiments, n-doped germanium layer 115 is about 400 Å thick. Next to n-doped germanium layer 115 is intrinsic germanium buffer layer 120. In embodiments, intrinsic germanium layer 120 is about 600 Å thick. In other embodiments, intrinsic germanium layer 120 is greater than about 600 Å thick. Next to intrinsic germanium layer 120 are SLS alternate germanium and silicon-germanium layers 125. For embodiments, 125 comprises hundreds of layers, and the silicon content of any layer can be zero. Similarly, each layer could have some silicon content. SLS alternate germanium and silicon-germanium layers 125 comprise pairs of alternating SLS single-crystal germanium layer 130 and SLS single crystal silicon-germanium layer 135. As mentioned, in embodiments the silicon content of any layer can be zero and each layer could have some silicon content. However, at least one of the paired layers has to have silicon to create the strain between layers. The alternating small/large lattice constants overcome silicon and germanium lattice mismatch, enabling an ultrathin layer of germanium on top of a layer of silicon-germanium with abrupt layer transitions for making hundreds of pairs of layers of superlattice. In embodiments, the first layer of the SLS intrinsic single-crystal germanium 130 is about 30 Å thick. In embodiments, the intrinsic single crystal silicon-germanium layer 135 is about 50 Å thick. Adjacent SLS alternate germanium and silicon-germanium layers 125 is second intrinsic germanium buffer layer 140. In embodiments, second intrinsic germanium buffer layer 140 is about 600 Å thick. In other embodiments, second intrinsic germanium barrier layer 140 is greater than about 600 Å thick. Adjacent second intrinsic germanium buffer layer 140 is p-doped germanium layer 145. In embodiments, p-doped layer 145 is about 1000 Å thick. This device can be formed by bulk manufacturing processes and exhibits abrupt transitions between layers. For embodiments, the initial n-doped layer can instead be p-doped, and the p-doped layer can instead be n-doped.

Figure 2:
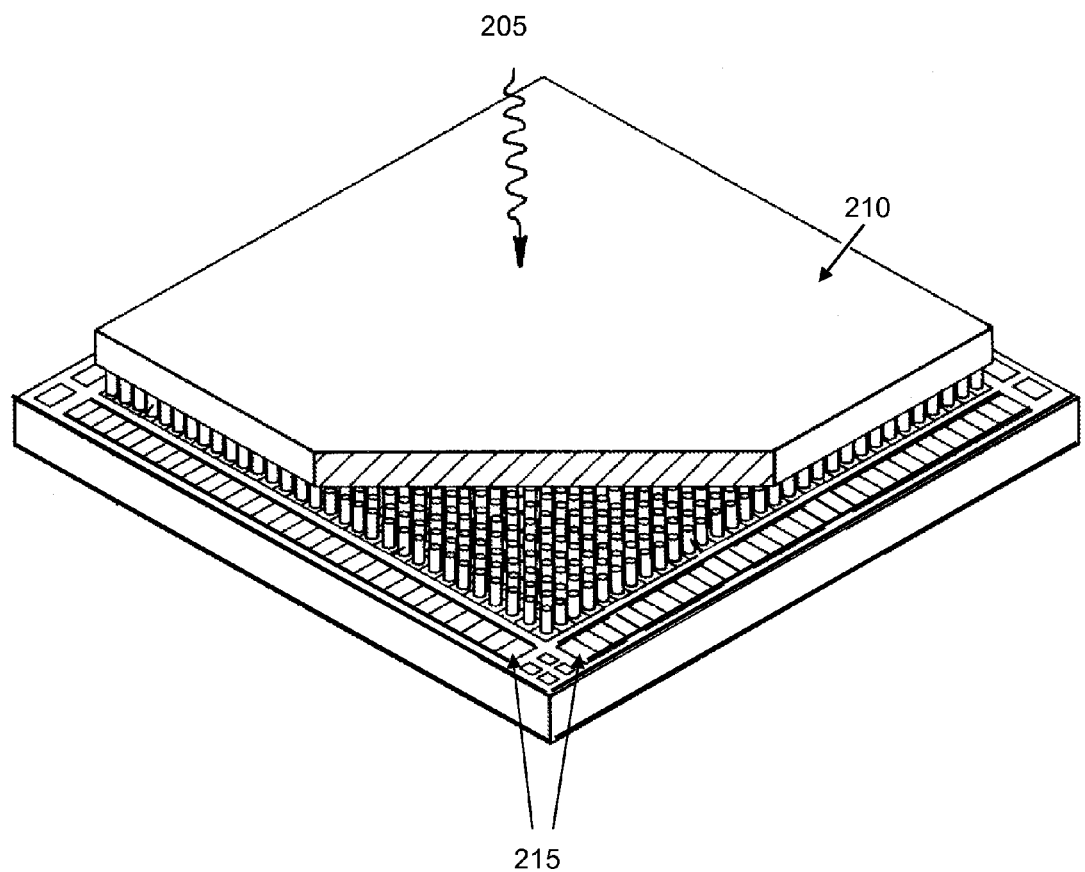
FIG. 2 is a depiction of a shortwave-infrared focal-plane array (SWIR FPA) configured in accordance with an embodiment of the invention.

FIG. 2 depicts a shortwave-infrared focal-plane array (SWIR FPA) 200 including a germanium/silicon-germanium superlattice. Incident infrared radiation 205 impinges vertical germanium photodetector stack array 210. Readout components 215 provide image signal output to associated components of the infrared imager employing the n-Ge/SLS/p-Ge stack.

Figure 3:
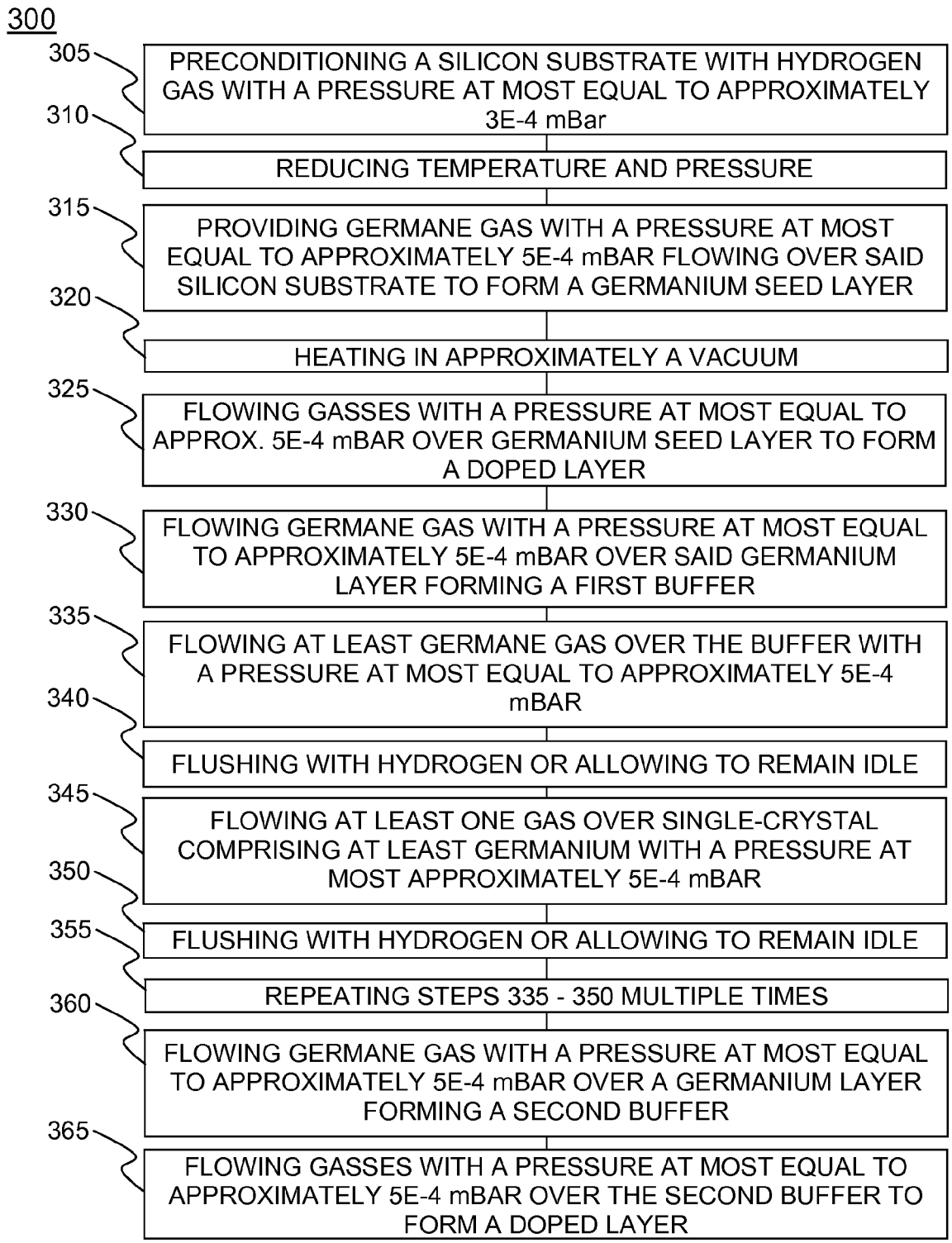
FIG. 3 is a flow chart of a fabrication method configured in accordance with an embodiment of the invention.

FIG. 3 illustrates a flow chart 300 of steps of a fabrication method. Steps comprise: (A) preconditioning a silicon substrate with hydrogen gas with a pressure at most equal to approximately $3E^{-4}$ mBar 305; (B) reducing temperature and pressure 310; (C) providing germane gas with a pressure at most equal to approximately $5E^{-4}$ mBAR flowing over said silicon substrate to form a germanium seed layer 315; (D) heating in approximately a vacuum 320; (E) flowing gasses with a pressure at most equal to approx. $5E^{-4}$ mBAR over germanium seed layer to form an n or p-doped germanium layer 325; (F) flowing germane gas with a pressure at most equal to approximately $5E^{-4}$ mBar over said germanium layer forming a first buffer 330; (G) flowing at least germane gas over the buffer with a pressure at most equal to approximately $5E^{-4}$ mBar 335; (H) flushing with hydrogen or allowing to remain idle 340; (I) flowing at least one gas over single-crystal comprising at least germanium with a pressure at most approximately $5E^{-4}$ mBar 345; (J) flushing with hydrogen or allowing to remain idle 350; (K) repeating steps 335-350 multiple times 355 to make SLS layers; (L) flowing germane gas with a pressure at most equal to approximately $5E^{-4}$ mBar over a germanium layer forming a second buffer 360; and (M) flowing gasses with a pressure at most equal to approximately $5E^{-4}$ mBar over the second buffer to form a p or n-doped layer 365.

The foregoing description of the embodiments of the invention has been presented for the purposes of illustration and description. It is not intended to be exhaustive or to limit the invention to the precise form disclosed. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure. Other and various embodiments will be readily apparent to those skilled in the art, from this description, figures, and the claims that follow. It is intended that the scope of the invention be limited not by this detailed description, but rather by the claims appended hereto.

What is claimed is:

1. A method of growing a germanium/silicon-germanium superlattice structure (SLS) comprising the steps of:
    (a) preconditioning a silicon substrate with hydrogen gas with a pressure at most equal to approximately $3E^{-4}$ mBar;
    (b) reducing temperature and pressure;
    (c) providing germane gas with a pressure at most equal to approximately $5E^{-4}$ mBar flowing over said silicon substrate to form a germanium seed layer;
    (d) heating in approximately a vacuum;
    (e) flowing gasses with a pressure at most equal to approximately $5E^{-4}$ mBar over said germanium seed layer to form a doped germanium layer;
    (f) flowing germane gas with a pressure at most equal to approximately $5E^{-4}$ mBar over said germanium layer forming a first buffer;
    (g) flowing at least germane gas over said first buffer with a pressure at most equal to approximately $5E^{-4}$ mBar, forming a layer of single-crystal comprising at least germanium;
    (h) flushing with hydrogen or allowing to remain idle;
    (i) flowing at least one gas over said single-crystal comprising at least germanium layer with a pressure at most approximately $5E^{-4}$ mBar, forming a subsequent layer of single-crystal comprising at least germanium;
    (j) flushing with hydrogen or allowing to remain idle;
    (k) repeating said steps (g) through (j) multiple times, forming SLS layers, wherein silicon content of alternate layers varies;
    (l) flowing germane gas with a pressure at most equal to approximately $5E^{-4}$ mBar over a germanium layer forming a second buffer; and
    (m) flowing gasses with a pressure at most equal to approximately $5E^{-4}$ mBar over said second buffer to form a doped layer.

2. The method of claim 1 wherein in said step (a) said preconditioning occurs at approximately 750° C. for approximately 60 minutes.

3. The method of claim 1 wherein in said step (b) said temperature is reduced to approximately 350° C. and the pressure is reduced to approximately vacuum.

4. The method of claim 3 wherein said temperature is reduced at a rate of approximately 2° C./min.

5. The method of claim 1 wherein in said step (c) said germane gas is flowed over said silicon substrate for approximately 120 minutes.

6. The method of claim 1 wherein in said step (d) said heating occurs at approximately 2° C./min until temperature is approximately 600° C.

7. The method of claim 1 wherein in said step (e) said gasses are selected from the group consisting of phosphine, diborane and germane for an n-doped layer, or selected from the group consisting of germane and diborane for a p-doped layer.

8. The method of claim 7 wherein in said step (e) said phosphine and germane gasses are provided at a ratio of approximately 1:3 respectively for approximately 10 minutes.

9. The method of claim 7 wherein in said step (e) said phosphine and germane gasses are provided such that said germanium seed layer is doped with phosphorus at a concentration of approximately $1E^{18}$ atoms/cm$^3$.

10. The method of claim 1 wherein said step (f) occurs for approximately 20 minutes, said step (g) occurs for approximately 1 minute, and said step (h) occurs for approximately 2 minutes.

11. The method of claim 1 wherein in said step (i) said at least one gas is selected from the group consisting of silane and germane.

12. The method of claim 1 wherein in said step (i) said gasses are provided in a 4:1 ratio of silane and germane.

13. The method of claim 1 wherein said step (i) occurs for approximately 90 seconds, said step (l) occurs for approximately 20 minutes, and said step (m) occurs for approximately 30 minutes.

14. The method of claim 1 wherein in said step (m) said gasses are selected from the group consisting of germane and diborane for a p-doped layer, or selected from the group consisting of phosphine, diborane and germane for an n-doped layer.

15. The method of claim 14 wherein said gasses occur at approximately a 1:50 ratio.

16. The method of claim 1 wherein in said step (m) a p-doped layer comprises a boron concentration of $5E^{17}$ atoms/cm$^3$.

17. The method of claim 1 wherein steps (g)-(j) are repeated to form at least 2 layers.

18. A method of growing a germanium/silicon-germanium superlattice structure (SLS) comprising:
    (a) preconditioning a silicon substrate with hydrogen gas at approximately 750° C. for 60 minutes with a pressure approximately equal to $3E^{-4}$ mBar;
    (b) reducing temperature to 350° C. at the rate of 2° C./min while maintaining vacuum as in (a);
    (c) flowing germane gas with a pressure equal to approximately $5E^{-4}$ mBar over said silicon substrate for approximately 120 minutes to form a germanium seed layer;
    (d) heating said germanium seed layer at approximately 2° C./min to approximately 600° C. while maintaining vacuum as in (c);
    (e) flowing phosphine and germane gasses at a ratio of approximately 1:3 respectively with a pressure approximately equal to $5E^{-4}$ mBar over said germanium seed layer for approximately 10 minutes to form an n-doped germanium layer;
    (f) flowing germane gas with a pressure approximately equal to $5E^{-4}$ mBar over said n-doped layer for approximately 20 minutes to grow a first buffer layer of germanium;
    (g) flowing at least germane gas with a pressure approximately equal to $5E^{-4}$ mBar for approximately 1 minute to form a layer of single-crystal comprising at least germanium;
    (h) flushing with hydrogen or allowing to sit idle under vacuum for approximately 2 minutes so that an abrupt junction will form when silicon-germanium is later grown on the existing germanium;
    (i) flowing a 4:1 mixture of silane and germane gasses with a pressure of approximately $5E^{-4}$ mBar for approximately 90 seconds to grow a layer of silicon-germanium on said layer of single-crystal comprising at least germanium;
(j) flushing with hydrogen or allowing to sit idle under vacuum for approximately 2 minutes so that an abrupt junction will form when germanium is later grown on the existing silicon-germanium;
(k) repeating said steps (g) through (j) multiple times, forming SLS layers;
(l) flowing germane gas with a pressure approximately equal to $5E^{-4}$ mBar for approximately 20 minutes to grow a second buffer layer of single-crystal germanium on said layer of silicon-germanium; and
(m) flowing diborane and germane gasses in a ratio of approximately 1:50 respectively with a pressure approximately equal to $5E^{-4}$ mBar for approximately 30 minutes over said second buffer to form a p-doped layer.

19. The method of claim 18 wherein said p-doped layer is approximately 1000 Å thick.

20. A short wave-infrared focal-plane array (SWIR FPA) comprising a detector with layers formed by bulk manufacturing processes and having abrupt transitions between superlattice structure (SLS) layers comprising the steps of:
(a) preconditioning a silicon substrate with hydrogen gas with a pressure at most equal to approximately $3E^{-4}$ mBar;
(b) reducing temperature and pressure;
(c) providing germane gas with a pressure at most equal to approximately $5E^{-4}$ mBar flowing over said silicon substrate to form a germanium seed layer;
(d) heating in approximately a vacuum;
(e) flowing gasses with a pressure at most equal to approximately $5E^{-4}$ mBar over said germanium seed layer to form an n-doped germanium layer;
(f) flowing germane gas with a pressure at most equal to approximately $5E^{-4}$ mBar over said germanium layer forming a first buffer;
(g) flowing at least germane gas over said first buffer with a pressure at most equal to approximately $5E^{-4}$ mBar, forming a layer of single-crystal comprising at least germanium;
(h) flushing with hydrogen or allowing to remain idle;
(i) flowing at least one gas over said single-crystal comprising at least germanium layer with a pressure at most approximately $5E^{-4}$ mBar, forming a subsequent layer of single-crystal comprising at least germanium;
(j) flushing with hydrogen or allowing to remain idle;
(k) repeating said steps (g) through (j) multiple times, forming SLS layers, wherein silicon content of alternate layers varies;
(l) flowing germane gas with a pressure at most equal to approximately 5E-4 mBar over a germanium layer forming a second buffer; and
(m) flowing gasses with a pressure at most equal to approximately $5E^{-4}$ mBar over said second buffer to form a p-doped layer, whereby said bulk manufacturing processes form said SWIR FPA having abrupt transitions between SLS layers.

\* \* \* \* \*